US011720502B2

(12) United States Patent
 Pawlowski

(10) Patent No.: US 11,720,502 B2
(45) Date of Patent: *Aug. 8, 2023

(54) CODEWORD ROTATION FOR ZONE GROUPING OF MEDIA CODEWORDS

(71) Applicant: Micron Technology, Inc., Boise, ID (US)

(72) Inventor: Joseph Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/468,160

(22) Filed: Sep. 7, 2021

(65) Prior Publication Data

US 2022/0066949 A1 Mar. 3, 2022

Related U.S. Application Data

(63) Continuation of application No. 16/414,771, filed on May 16, 2019, now Pat. No. 11,119,946.

(51) Int. Cl.
 *G06F 12/12* (2016.01)
 *G06F 12/0804* (2016.01)
 (Continued)

(52) U.S. Cl.
 CPC .......... *G06F 12/12* (2013.01); *G06F 12/0804* (2013.01); *G06F 12/0891* (2013.01);
 (Continued)

(58) Field of Classification Search
 None
 See application file for complete search history.

(56) References Cited

U.S. PATENT DOCUMENTS

| 7,689,762 B2 | 3/2010 | Hobson |
| 8,806,171 B2 | 8/2014 | Seong et al. |

(Continued)

FOREIGN PATENT DOCUMENTS

| CN | 101675479 A | 3/2010 |
| CN | 102981971 A | 3/2013 |

(Continued)

OTHER PUBLICATIONS

ISA/KR, International Search Report and Written Opinion of the International Searching Authority, Int'l Appl. No. PCT/US2020/031693, dated Aug. 24, 2020, Korean Intellectual Property Office, Seo-gu, Daejeon, Republic of Korea, 10 pgs.

(Continued)

*Primary Examiner* — Charles Rones
*Assistant Examiner* — Ryan Dare
(74) *Attorney, Agent, or Firm* — Holland & Hart LLP

(57) ABSTRACT

Methods, systems, and devices for codeword rotation for zone grouping of media codewords are described. A value of a first pointer may be configured to correspond to a first memory address within a region of memory and a value of a second pointer may be configured to correspond to a second memory address within the region of memory. The method may include monitoring access commands for performing access operations within the region of memory, where the plurality of access command may be associated with requested addresses within the region of memory. The method may include updating the value of the second pointer bases on a quantity of the commands that are monitored satisfying a threshold and executing the plurality of commands on locations within the region of memory. The locations may be based on the requested address, the value of the first pointer, and the value of the second pointer.

20 Claims, 8 Drawing Sheets

(51) Int. Cl.
    *H03M 13/27*     (2006.01)
    *H03M 13/00*     (2006.01)
    *G06F 12/0891*     (2016.01)

(52) U.S. Cl.
    CPC ... *H03M 13/2782* (2013.01); *H03M 13/6563* (2013.01); *H03M 13/6566* (2013.01)

(56) References Cited

U.S. PATENT DOCUMENTS

| | | |
|---|---|---|
| 9,256,531 B2 | 2/2016 | Cho |
| 10,003,675 B2 | 6/2018 | Curewitz et al. |
| 2008/0276035 A1 | 11/2008 | Hobson |
| 2012/0079172 A1 | 3/2012 | Yoshida |
| 2015/0154107 A1 | 6/2015 | Nelson et al. |
| 2015/0269067 A1 | 9/2015 | Pendharkar et al. |
| 2016/0118132 A1 | 4/2016 | Prins et al. |
| 2016/0147467 A1 | 5/2016 | Roberts |
| 2018/0046576 A1 | 2/2018 | Lesartre et al. |
| 2018/0060227 A1 | 3/2018 | Tang et al. |
| 2018/0268913 A1 | 9/2018 | Akkerman et al. |

FOREIGN PATENT DOCUMENTS

| | | |
|---|---|---|
| CN | 102981972 A | 3/2013 |
| CN | 105930280 A | 9/2016 |

OTHER PUBLICATIONS

Chinese Patent Office, "Office Action and Search Report", issued in connection with Chinese Patent Application No. 202080040394.7 dated Aug. 3, 2022 (16 pages).

European Patent Office, "Search report," issued in connection with Europeam Patent Application No. 20805649.9 dated May. 17, 2023 (8 pages).

CODEWORD ROTATION FOR ZONE GROUPING OF MEDIA CODEWORDS

CROSS REFERENCE

The present application for patent is a continuation of U.S. patent application Ser. No. 16/414,771 by Pawlowski, entitled "CODEWORD ROTATION FOR ZONE GROUPING OF MEDIA CODEWORDS" filed May 16, 2019, assigned to the assignee hereof, and is expressly incorporated by reference in its entirety herein.

BACKGROUND

The following relates generally to a system that includes at least one memory device and more specifically to codeword rotation for zone grouping of media codewords.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving a computing system may include enhancing a memory subsystem's performance such as reducing power consumption, increasing memory capacity, improving read/write speeds, providing non-volatility by use of persistent memory media, or reducing manufacturing costs at a certain performance point, among other metrics. Some types of memory may have limits with regard to a number of access operations (e.g., write operations and/or read operations) that may be performed on each cell without degradation in memory performance. In addition, some patterns of memory accesses may frequently access certain regions of memory, including some that may intentionally try to disrupt the stored memory states. Thus, maintaining memory performance under various conditions, including the presence of malicious actors, may provide challenges.

DETAILED DESCRIPTION

Figure 1:
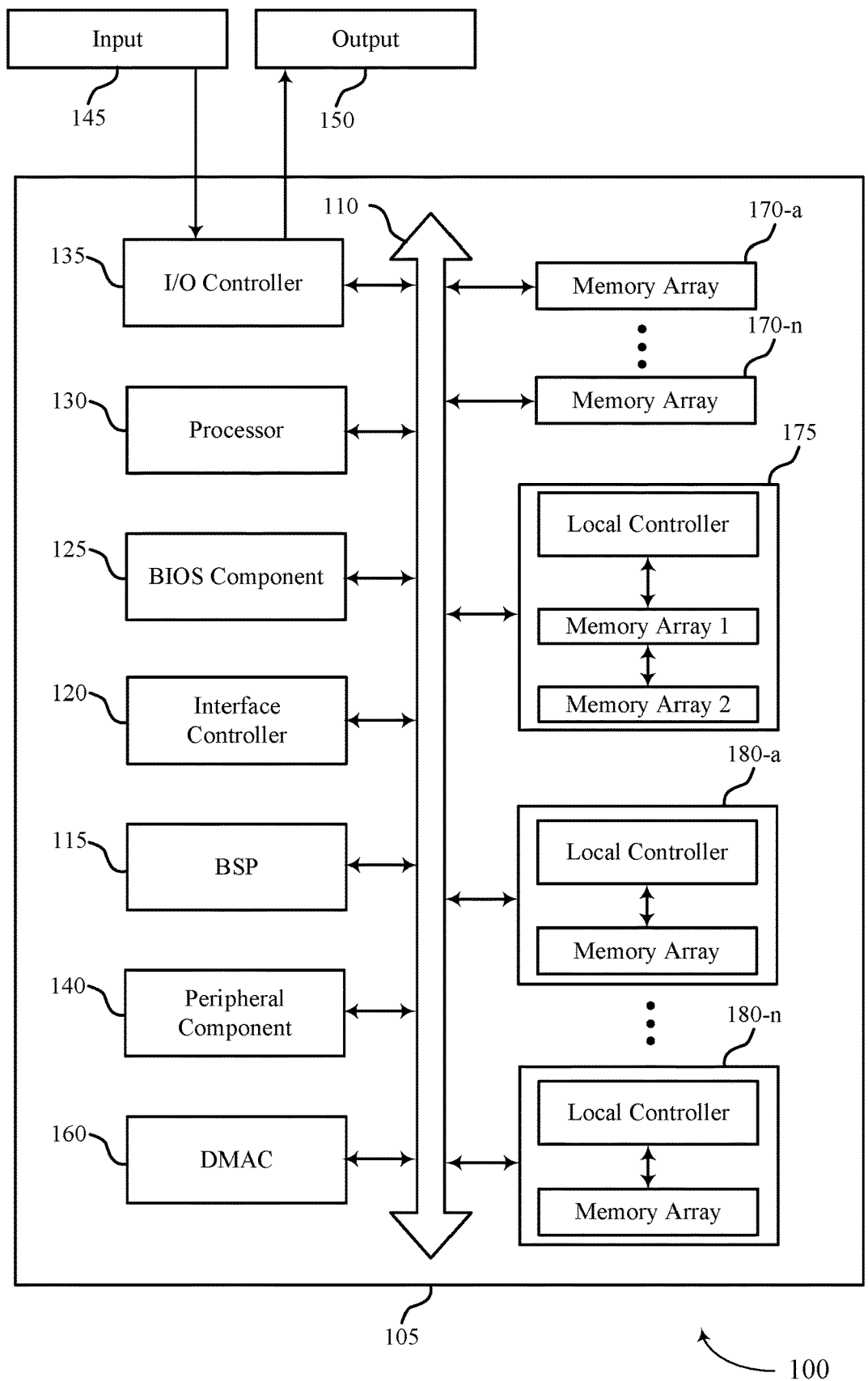
FIG. 1 illustrates an example of a computing system that supports a multi-port storage-class memory interface in accordance with examples of the present disclosure.

Memory cells of a memory device may wear-out or stop reliably storing a memory state when the quantity of access operations (e.g., reads, writes, etc.) to those cells surpass a wear threshold. In some cases, one or more memory cells may be subjected to a higher concentration of access operations, for example, due to normal operations of a memory device or a malicious attack. Accordingly, some memory cells may wear-out before other, less accessed, memory cells of a memory array. As such, logic states stored at those cells may become corrupted, or if identified, a memory device may need to dedicate resources to correcting errors or storing data associated with worn out memory cells.

A memory device may include one or more logical structures for associating memory addresses with physical memory locations. For example, a memory array may have zones that associate codeword addresses with physical locations (e.g., memory cells) of a memory array. In some cases, a memory device may perform wear leveling operations as part of performing access operations associated with codewords stored at one or more zones. In some cases, a memory device may establish a zone consisting of multiple codeword address locations. The memory device may define an extra address for a memory zone that is used to perform a code-word rotation for wear-out protection and wear smoothing functions.

The memory device may configure a base pointer (e.g., a first pointer) to correspond to a first codeword address within a region of memory and configure a free pointer (e.g., a second pointer) to correspond to a last codeword address within a zone of memory. The memory device may monitor access commands to the zone of memory and update a codeword address of the free pointer each time a quantity of access commands satisfies a threshold. For example, the memory device may decrement the free pointer by one codeword address each time the number of access commands satisfies a threshold. Further each time an access command specifies greater than the free pointer address, the memory device may write that codeword to a different codeword address. For example, the memory address may increment the command address by one. Once the free pointer has been decremented to equal the address of the base pointer, the memory device may increment the base pointer by one and continue to decrement the free pointer each time a further quantity of access commands satisfies the threshold. Accordingly, the memory device may shift or smooth access operations to memory cells that receive a higher concentration of access commands to distribute access operations across a greater number of memory cells of the zone.

Features of the disclosure introduced above are further described below in the context of FIG. 1. Specific examples are then described for FIGS. 2 through 5. These and other features of the disclosure are further illustrated by and described with reference to an apparatus diagram and flowcharts that relate to codeword rotation for zone grouping of media codewords as described with references to FIGS. 6-8.

FIG. 1 illustrates an example of a computing system 100 that supports a multi-port storage-class memory interface in accordance with examples of the present disclosure. The computing system 100 may include a device 105. The device 105 may include a processor 130, an interface controller 120, and various memory devices 170, 175, and 180. The memory devices 170, 175, and 180 may be referred to as memory media. The device 105 may also include an input/output controller 135, a basic input/output system (BIOS) component 125, a board support package (BSP) 115, a peripheral component(s) 140, a direct memory access controller (DMAC) 160. The components of the device 105 may be in electronic communication with one another through a bus 110.

The device 105 may be a memory subsystem or memory component, computing device, electronic device, mobile computing device, or wireless device. The device 105 may be a portable electronic device. The device 105 may be a computer, a laptop computer, a tablet computer, a smartphone, a cellular phone, a wearable device, an internet-connected device, or the like. In some cases, the device 105 may be configured for bi-directional wireless communication with or via a base station or access point.

The processor 130 may be configured to operate with various memory media 170, 175, 180, or any combination thereof, either directly or via the interface controller 120. In some cases, the processor 130 may perform functions of the interface controller 120. The processor 130 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

The interface controller 120 may be configured to operate with the processor 130. In some examples, the interface controller 120 may be integrated as a part of the processor 130. The interface controller 120 may also be configured to operate with various memory media 170, 175, 180, or any combination thereof.

The memory media 170 may each include an array or arrays of memory cells to store digital information. The memory media 170 may be configured to operate with the processor 130, the interface controller 120, or both. In some examples, the memory media 170 may be configured to serve as a buffer memory for a memory bank for the processor 130 or the interface controller 120.

The memory media 175 may include a local controller configured to operate with an array of memory cells structured in two or more tiers. The local controller of the memory media 175 may also be configured to operate the processor 130 or the interface controller 120. The local controller of the memory media 175 may be configured to take advantage of different characteristics of memory cells to efficiently operate with the processor 130 or the interface controller 120. In some examples, first-tier memory cells may be 3DXP memory that may provide a high number of input/output operations per second (IOPS) with a short response time to handle various workloads. In some examples, second-tier memory cells may be three-dimensional NAND memory that may provide high capacity for data storage at a relatively lower cost than the first-tier memory cells. The memory media 175 may include other types or combinations of memory arrays in some cases.

The memory media 180 may include a local controller configured to operate with an array or arrays of memory cells. The local controller of the memory media 180 may also be configured to operate with the processor 130 or the interface controller 120. In some examples, memory cells may include non-volatile, or volatile memory cells, or a combination of non-volatile and volatile memory cells. In some examples, the local controller of the memory media 180 may be configured to handle a variable page size for a memory array where the memory array includes non-volatile memory cells, e.g., ferroelectric memory cells. In some examples, one or more memory media 180 may be present in device 105. In some examples, the local controllers of the memory media 180 may be configured to manage codewords divided across multiple memory dice where the memory dice include arrays of 3DXP memory cells. In some examples, the processor 130 or the interface controller 120 may be configured to receive portions of the divided codewords from the local controllers of the memory media 180 to generate the codewords in their entirety. In some examples, the 3DXP memory arrays may include a plurality of partitions (e.g., 32 partitions). Each partition of the plurality of partitions may be further configured to concurrently perform a task with other partitions.

The DMAC 160 may enable the processor 130 to perform direct memory accesses with the memory media 170, 175, or 180. For example, the DMAC 160 may support the processor 130 to directly access a memory medium 170, 175, or 180 without the involvement or operation of the interface controller 120.

The peripheral component(s) 140 may be an input or output device, or an interface for such devices, that may be integrated into the device 105. Examples may include a disk controller, a sound controller, a graphics controller, an Ethernet controller, a modem, a universal serial bus (USB) controller, a serial or parallel port, or peripheral card slots, such as peripheral component interconnect (PCI) or accelerated graphics port (AGP) slots. The peripheral component(s) 140 may be other components understood by those skilled in the art as peripherals.

The BIOS component 125 or the BSP 115 may be a software component that includes a basic input/output system (BIOS) operated as firmware, which may initialize and run various hardware components of the computing system 100. The BIOS component 125 or the BSP 115 may also manage data flow between the processor 130 and the various components, e.g., the peripheral components 140, the input/output controller 135. The BIOS component 125 or the BSP 115 may include a program or software stored in read-only memory (ROM), flash memory, or any other non-volatile memory.

The input/output controller 135 may manage data communication between the processor 130 and the peripheral component(s) 140, the input devices 145, or the output devices 150. The input/output controller 135 may also manage external peripherals that are not part of the device 105. In some cases, the input/output controller 135 may represent a physical connection or port to the external peripheral.

The input 145 may represent a device, a signal, or an interface external to the device 105 that provides input to the device 105 or its components. This may include a user interface or interface with or between other devices. In some cases, the input 145 may be a peripheral that interfaces with the device 105 via the peripheral component(s) 140 or may be managed by the input/output controller 135. In some examples, the input 145 may be a host link associated with a host device or a host interface.

The output 150 may represent a device, a signal, or an interface external to the device 105 configured to receive output from the device 105 or any of its components. Examples of the output 150 may include a display, audio speakers, a printing device, or another processor on printed circuit board, etc. In some cases, the output 150 may be a peripheral that interfaces with the device 105 via the peripheral component(s) 140 or may be managed by the input/output controller 135. In some examples, the output 150 may be a host link associated with a host device or a host interface.

The components of the device 105 may include circuitry designed to carry out various functions of the components. This may include various circuit elements, for example, conductive lines, transistors, capacitors, inductors, resistors, amplifiers, or other active or passive elements, configured to carry out the functions of the components described herein.

The device 105, in some examples, may be configured with one or more interface components and may receive an access command or a host request (e.g., through the input 145) from a host device (not shown). The interface components may be configured to be compatible with the Gen-Z or the CCIX protocol, among other examples. The host request (e.g., a read operation, a write operation) may be associated with a host address and the device 105 may generate a second command with an interleaved address based on the information in the host request to parallelize the operation across multiple media ports. In some examples, the device 105 may be configured to generate physical media addresses (e.g., addresses associated with the memory media 170, 175, or 180) with a low latency based on the incoming host addresses. The device 105 may then retrieve the data requested by the host (e.g., when the host request includes a read operation) from the multiple media ports as a result of or based on sending the second command to local controllers associated with the memory media (e.g., the memory media 175 or 180). Subsequently, the device 105 may generate a packet of data to send to the host (e.g., through the output 150) through the interface components in accordance with the protocol associated with the host link.

Figure 2:
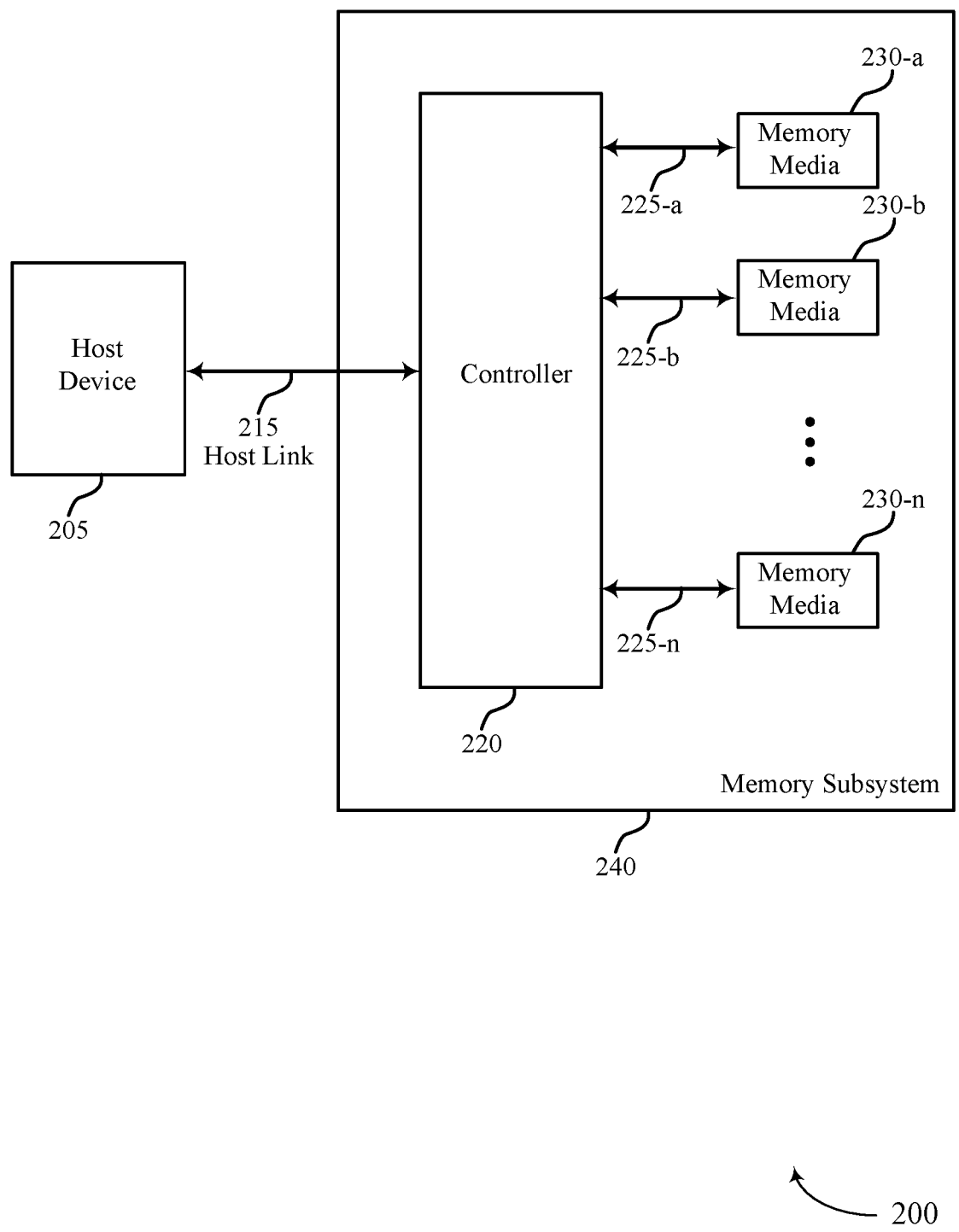
FIG. 2 illustrates an example of a computing system configured with an interface that supports a multi-port storage-class memory interface in accordance with examples of the present disclosure.

FIG. 2 illustrates an example of a computing system 200 configured with an interface that supports a multi-port storage-class memory interface in accordance with various examples of the present disclosure. The computing system 200 may be an example of the computing system 100 described with reference to FIG. 1. The computing system 200 may include a host device 205 coupled with a device 240 through a host link 215. The host device 205 may be a server, a system on a chip (SoC), or a central processing unit (CPU). In some examples, the host device 205 may access (e.g., read from, write to) one or more memory media 230 located in the device 240 through the host link 215. In addition, the host device 205 may set up registers to configure how to access the memory media 230.

The host link 215 may be an example of the input 145, the output 150, or a combination thereof, described with reference to FIG. 1. The host link 215 may employ a protocol (e.g., the Gen-Z, the CCIX protocol). In some examples, the host link 215 may be configured to transfer data at a data transfer rate (e.g., 25 gigabytes per second (GBps)) each direction (e.g., sending or receiving) through the host link. In some examples, a 25 GBps data transfer rate may support 586 million transactions per second when a transaction is 64 bytes. In other examples, a 25 GBps data transfer rate may support 312.5 million transactions per second when a transaction is 128 bytes.

The device 240 may be an example of the device 105 described with reference to FIG. 1. The device 240 may include a controller 220 that may be coupled with memory media 230 through aggregated channels 225. In some examples, the controller 220 and the memory media 230 may be integrated with, in contact with, or placed on a board (e.g., a peripheral component interconnect express (PCIe) board). In some examples, the device 240 may be referred to as a memory subsystem or a memory component. The controller 220 may include various functional blocks of the device 105 other than the memory media 170, 175, and 180 described with reference to FIG. 1. In some examples, the controller 220 may be an ASIC, a general-purpose processor, other programmable logic device, discrete hardware components, or it may be a combination of these types of components. In some examples, the controller 220 may receive, from the host device 205, a host request (e.g., an access command to read from or write to memory cells in the memory media 230) through the host link 215. In some examples, the controller 220 may generate a command including an interleaved address for the memory media 230 based on information in the host request (e.g., a host address). The interleaved addresses may be associated with the one or more memory media 230.

The controller 220, in some examples, may send the command including the interleaved address to local controllers (e.g., local controllers of the memory media 175 or 180 described with reference to FIG. 1) associated with the memory media 230. In some examples, the controller 220 may read data from or write data at the memory media 230 in conjunction with the local controllers performing various operations (e.g., writing data to memory cells, reading data from memory cells, arranging data in a format compatible with a configuration of the aggregated channels 225). In some examples, the local controllers may send requested data to the controller 220 through the aggregated channels 225. In some examples, the local controllers may send an indication of successful writing of data in response to receiving the command (e.g., a write command). In some examples, the controller 220 may store data received from the local controllers at cache memory (e.g., the cache 365-*a* described with reference to FIG. 3). In some examples, the controller 220 may assemble data packages containing contents of the memory media 230 to a consumable form that the host device 205 may use. The controller 220 may send the data packages to the host device 205 through the host link 215 in accordance with the interface protocol (e.g., the Gen-Z, the CCIX protocol).

An individual memory medium (e.g., the memory medium 230-*a*) of the memory media 230, in some examples, may include multiple memory dice (e.g., sixteen memory dice) to obtain a desired memory capacity. Each memory die may include the local controller (e.g., local controllers of the memory media 175 or 180 described with reference to FIG. 1) to collaborate with the controller 220 and to manage various memory operations within the memory die. In addition, the multiple memory dice within the individual memory medium may operate in parallel to generate a desired aggregated data transfer rate.

In some examples, the memory dice may include non-volatile memory cells (e.g., 3DXP array of phase change memory cells). In other examples, the memory dice may include non-volatile memory cells including a chalcogenide alloy. In some examples, a codeword (e.g., 128 bytes of a unit of data) may be divided across the multiple memory dice within the memory medium (e.g., the memory medium 230-a). The aggregated channels 225 may be configured to transport data between the controller 220 and the memory media 230 (e.g., the local controllers). In some examples, each of the aggregated channels 225 (e.g., the aggregated channel 225-a) may include a first number (e.g., eight) of logical channels for data transport. In some examples, each aggregated channel of the aggregated channels 225 (e.g., the aggregated channel 225-a) may include additional channels to carry information related to various auxiliary functions such as error-correction code (ECC) or metadata.

Figure 3:
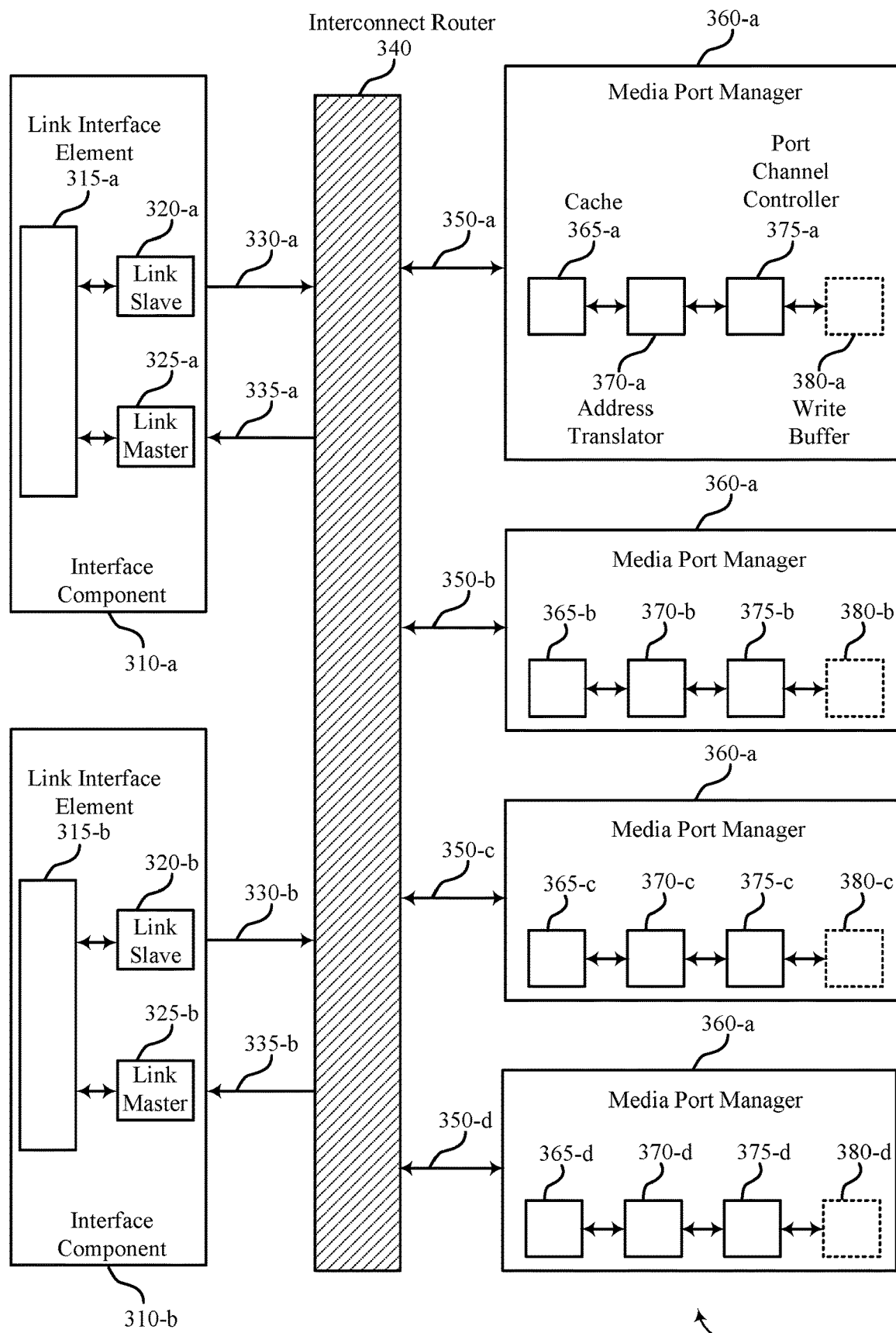
FIG. 3 illustrates an example of a device that supports a multi-port storage-class memory interface in accordance with examples of the present disclosure.
Figure 4:
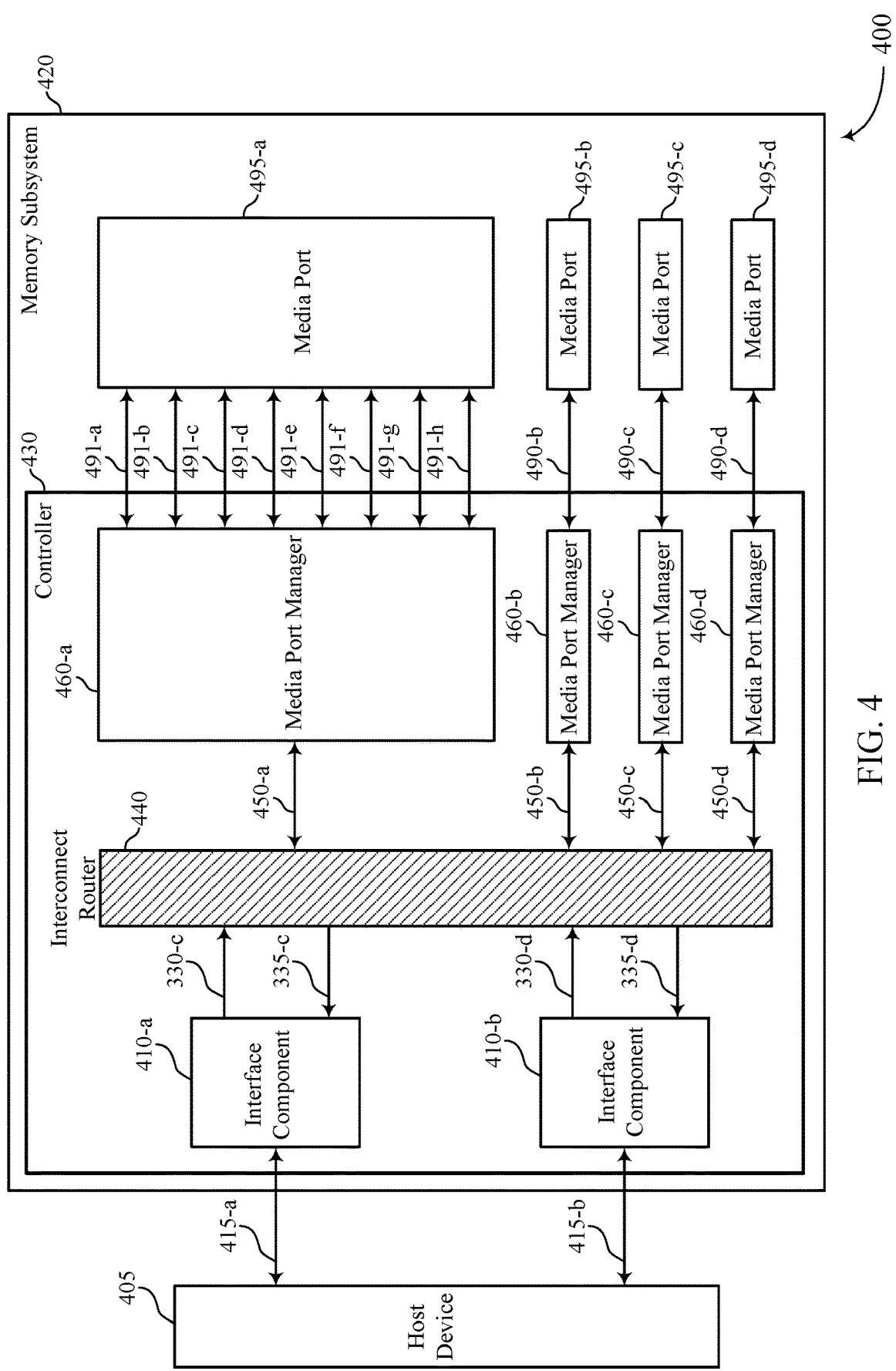
FIG. 4 illustrates an example of a computing system that supports a multi-port storage-class memory interface in accordance with examples of the present disclosure.

FIG. 3 illustrates an example of a device 300 that supports a multi-port storage-class memory interface in accordance with various examples of the present disclosure. The device 300 may be an example of the interface controller 120 or the controller 220 described with reference to FIGS. 1 and 2. In some examples, the device 300 may be an ASIC. The device 300 may include one or more interface components 310 that may be coupled with a host device (not shown) using a host link that employs an interface protocol (e.g., the Gen-Z protocol, the CCIX protocol) as explained above. The device 300 may also include an interconnect router 340 coupled between the interface components 310 and one or more media port managers 360. An individual media port manager (e.g., the media port manager 360-a) may be coupled with a memory medium using one of the aggregated channels 225 or 490 as depicted in FIGS. 2 and 4.

The interface components 310 may include a link interface element 315, a link slave 320, and a link master 325. The link interface element 315 may include physical layers for transmitting and receiving data through a host link coupled with a host device. In some examples, the link interface element 315 may be configured to transfer data at a first data transfer rate (e.g., 25 GBps) in each direction (e.g., sending or receiving) through the host link. The link slave 320 may receive a transaction-layer protocol packet through the host link and may decode the packet to extract a request from the host device as well as addresses and data associated with the request.

In some examples, the link slave 320 may send the decoded information to the interconnect router 340 at the first data transfer rate (e.g., 25 GBps) through a first signal path 330 (e.g., the first signal path 330-a). The link master 325 may generate a transactional-layer protocol packet and transmit the packet to the host through the host link. In some examples, the link master 325 may receive information from the interconnect router 340 at the first data transfer rate (e.g., 25 GBps) through a second signal path 335 (e.g., the second signal path 335-a). By way of example, the device 300 depicted in FIG. 3 includes two interface components 310-a and 310-b and may be capable of handling a total data transfer rate of 100 GBps when coupled with a host device using two host links, e.g., a first host link coupled with the interface component 310-a and a second host link coupled with the interface component 310-b. As a person of ordinary skill in the art would appreciate, however, other alternatives and different variations are specifically contemplated and fall within the scope of this disclosure.

The interconnect router 340, in some examples, may provide a routing network to allow more than one host link to connect to more than one media port associated with the media port managers 360. In some cases, the interconnect router 340 may be considered as an array of switches. By way of example, the device 300 depicted in FIG. 3 illustrates that the first host link, using the interface component 310-a, may connect to one or more media port managers (e.g., 360-a, 360-b, 360-c, and 360-d) while the second host link, using the interface component 310-b, may concurrently connect to the one or more media port managers (e.g., 360-a, 360-b, 360-c, and 360-d). During the routing process the interconnect router 340 may generate interleaved addresses from host addresses (e.g., sequential addresses designated with a block of memory space) to distribute the request from the host device across multiple media ports. So the host address (e.g., sequential addresses) may be in the domain of the interface component 310 while the interleaved addresses may be in the domain of the media port managers 360 and associated memory media. The interleaved addressing scheme may, in some examples, be configured to leave no gap in the block of memory space associated with the host address (e.g., sequential addresses). In some examples, the interconnect router 340 may exchange data with the media port managers 360 through third signal paths 350. In some examples, each path of the third signal paths (e.g., the third signal path 350-a) may be configured to exchange data at a second data transfer rate (e.g., 12.8 GBps) as described below.

An individual media port manager of the media port managers 360 may include a cache 365, an address translator 370, and a port channel controller 375. In some cases, an individual media port manager (e.g., the media port manager 360-a) may be capable of executing a separate media port logic algorithm so that each media port manager may operate completely independent of each other (e.g., media port managers 360-b, 360-c, or 360-d).

The cache 365 may include a fully-associated write-back cache and associated content-addressable memory (CAM). In some cases, CAM may search its memory space when presented with a data (e.g., content of an address) to see if the data are stored anywhere in CAM. Such CAM operation may consume relatively more power than a conventional memory (e.g., DRAM). The cache 365 may increase performance of the device 240 or the memory subsystem 420 described with reference to FIGS. 2 and 4. In some cases, the cache 365-a including CAM may facilitate the media port manager 360-a to determine whether content of an address presented is within the cache 365-a or not. The media port manager 360-a may fetch the content (e.g., from static random access memory (SRAM) within the cache 365-a when the content is found and thus avoiding additional latency) or take subsequent steps (e.g., determining to access a memory medium when the content is not found in the cache 365-a and accessing the memory medium associated with the media port manager 360-a).

A distributed-cache configuration may alleviate issues related to a power consumption associated with CAM in comparison to a centralized-cache configuration. By way of example, the distributed-cache configuration depicted in FIG. 3 (e.g., the cache 365-a, 365-b, 365-c, and 365-d) may reduce power consumption (e.g., down to one-fourth) compared to a single cache configuration because one or more caches (e.g., the cache 365-a, 365-b, 365-c, or 365-d) may be inactive for one or more CAM search operations. The distributed-cache configuration may also improve efficiency of the memory subsystem because each cache of the distributed-cache may operate independent of each other and distribute loading of cache to handle requests in parallel. In addition, the cache 365 may facilitate shielding the memory media from excessive transactions (e.g., read or write operations to memory cells) by distributing a number of read or write cycles within a wear-leveling pool. The cache 365 may also store data fetched from memory media before the link master 325 formulates packet response to send to the host. The cache 365 may operate using logical addresses (e.g., interleaved addresses associated with a set of media ports) described with reference to FIG. 5A.

The address translator 370 may be associated with managing intra-zone wear-leveling operation described with reference to FIG. 5B. The address translator 370 may include an address randomizer, a zone translate SRAM/table (ZTS), a base-free zone rotation logic, or a zone remap logic. Intermediate addresses, described with reference to FIG. 5A, may be in the address translator 370.

The port channel controller 375 may include a command queue and associated conflict-control logic, a write data buffer, a media ECC encoder, a media ECC decoder, a read response queue, or an input/output for a memory medium. The port channel controller 375 may operate using physical addresses described with reference to FIG. 5A.

In some cases, an individual media port manager of the media port managers may include a write buffer 380. The write buffer 380 may be configured to hold a write-to-read drift buffer (e.g., a write-to-read buffer) and associated CAM or a write victim cache and associated CAM. In some examples, the write buffer 380 may be configured to store data that is written to a memory medium within a certain time duration.

FIG. 4 illustrates an example of a computing system 400 that supports a multi-port storage-class memory interface in accordance with various examples of the present disclosure. The computing system 400 may be an example of the computing system 100 or 200 described with reference to FIGS. 1 and 2. The computing system 400 may include a host device 405 coupled with a memory subsystem 420 using host links 415. The host device 405 may be an example of the host device 205 described with reference to FIG. 2. The host links 415 may be an example of the host links 215 described with reference to FIG. 2. In some examples, the host link 415-*a* may be configured to transfer data at a data transfer rate (e.g., 50 GBps with 25 GBps in each direction). By way of example, the computing system 400 depicted in FIG. 4 may be configured to transfer data at a second data transfer rate (e.g., 100 GBps) in light of two host links such as the host link 415-*a* and the host link 415-*b*, which may each be configured to transfer data (e.g., 50 GBps).

The computing system 400 may include the memory subsystem 420. The memory subsystem 420 may be an example of the device 105 or the device 240 described with reference to FIGS. 1 and 2. The memory subsystem 420 may include a controller 430. The controller 430 may be an example of the device 300 described with reference to FIG. 3. The controller 430 may include one or more interface components 410, an interconnect router 440, and one or more media port managers 460. The interface components 410, the interconnect router 440, and the media port managers 460 may be an example of the interface components 310, the interconnect router 340, and the media port managers 360 described with reference to FIG. 3, respectively.

In some examples, an individual media port manager of the media port managers 460 (e.g., the media port manager 460-*b*) may be coupled with one of media ports 495 (e.g., the media port 495-*b*) through one of aggregated channels 490 (e.g., the aggregated channel 490-*b*). The media ports 495 may be examples of the memory media 230 described with reference to FIG. 2. An individual aggregated channel of the aggregated channels 490 may include one or more logical channels 491. In some examples, each of the aggregated channels 490 may include eight logical channels 491. Eight logical channels (e.g., the logical channel 491-*a* through the logical channel 491-*h*) are illustrated for the media port manager 460-*a* representing one of the aggregated channels 490 (e.g., the aggregated channel 490-*a* (not shown)) while the aggregated channels 490 (e.g., the aggregated channel 490-*b*, 490-*c*, and 490-*d*) are illustrated for media port managers 460-*b*, 460-*c*, and 460-*d* in an effort to increase visibility and clarity of the depicted features.

An individual media port of the media ports 495 (e.g., the media port 495-*a*), in some examples, may include one or more memory devices (e.g., memory devices with 3DXP memory cells, also referred to as 3DXP dice hereinafter). In some cases, the memory devices may operate in parallel to obtain a desired aggregated bandwidth through the aggregated channels 490. In some examples, one 3DXP die may have a memory capacity of 256 gigabits, e.g., 32 gigabytes. In some examples, one of the media ports 495 may include sixteen such 3DXP dice to generate a 512 gigabyte capacity, i.e., 0.5 terabyte capacity per a media port (e.g., the media port 495-*a*). In some examples, the 3DXP die may be configured to have a 8-bits wide data bus and two 3DXP dice may be assigned to each logical channel (e.g., the channel 491-*a*) rendering each logical channel 16-bits (e.g., two-bytes) wide. In some examples, an individual aggregated channel of the aggregate channels 490 may include eight logical channels (e.g., the aggregated channel 490-*a* including the logical channel 491-*a* through the channel 491-*h*). As a result, when sixteen 3DXP dice operate at 800 MHz in parallel, each of the aggregate channels 490 may operate at a bandwidth of 12.8 GBps (i.e., 2 bytes per the logical channel 491 leading to 16 bytes per the aggregated channel 490 (e.g., the aggregated channel 490-*a*) operating at 800 MHz). The above description may be understood from a logical view of the media ports. In some examples, a larger number of physical 3DXP dice than a number of logical 3DXP dice may be present in a media port accounting for an overhead related to memory operations associated with the media port.

Each 3DXP memory die, in some examples, may be configured to include a number (e.g., thirty-two) of partitions. Each partition of a 3DXP die may concurrently operate independent of the other partitions within the 3DXP die. In some examples, each logical channel (e.g., the logical channel 491-*a*) may be coupled with two 3DXP dice, thus a total of 64 partitions may be coupled with a logical channel (e.g., the logical channel 491-*a*). The controller 430 may access one partition of a 3DXP die coupled with a logical channel rotating through each media port.

By way of example using the memory subsystem 420 depicted in FIG. 4, the controller 430 may access a first partition (e.g., partition 1 out of 32 partitions) of a 3DXP die (e.g., 3DXP die A, not shown) in the media port 495-*a*. The controller 430 may then access a first partition (e.g., partition 1 out of 32 partitions) of a 3DXP die (e.g., 3DXP die B, not shown) in the media port 495-*b*. The controller 430 may then access a first partition (e.g., partition 1 out of 32 partitions) of a 3DXP die (e.g., 3DXP die C, not shown) in the media port 495-*c*. The controller 430 may then access a first partition (e.g., partition 1 out of 32 partitions) of a 3DXP die (e.g., 3DXP die D, not shown) in the media port 495-*d*. Then, the controller 430 may go back to the media port 495-*a* and access a second partition (e.g., partition 2 out of 32 partitions) of a 3DXP die (e.g., 3DXP die A, not shown) in the media port 495-*a*. The controller 430 may repeat the operations described above repeating a total of 64 times rotating through four media ports because two 3DXP dice are coupled to a logical channel rendering 64 partitions per logical channel.

Within a media port, a codeword may be divided into more than one die (e.g., a 128 byte codewords divided across four 3DXP dice). Such division may be feasible based on the nature of each partition operating independent of other partitions within a 3DXP die. In some cases, only one partition may be accessed per a transaction (e.g., one partition out thirty-two partitions within a 3DXP die) in conjunction with a number of parallel accessing across the number of 3DXP dice present in the media port as depicted by the parallel logical channels (e.g., the logical channels 491-*a* through 491-*h*). Such parallel operation may reduce a processing time associated with an error-correction code (ECC) operation on the information acquired by the divided codewords and parallel processing of the divided codewords across a number of 3DXP dice. The port channel controller 375 may handle the divided codewords and parallel processing of the divided codewords.

Various examples using 3DXP dice illustrate how the media ports 495 in the memory subsystem 420 may be configured and function in accordance with the methods, devices, and systems of the present disclosure. In some cases, the media ports 495 may include other memory devices employing different memory technologies than 3DXP technology. As such, the present disclosure is not limited to 3DXP dice.

As described above, the controller 430 may utilize the independent nature of the media port managers 460 (e.g., the media port manager 460-*a* operating independently of the other three media port managers 460-*b*, 460-*c*, and 460-*d*) and the independent nature of the memory media (e.g., one partition out of thirty-two partitions operating independently of the other thirty-one partitions in a 3DXP memory die) to acquire a desired data transfer rate with low latency to support a high-performance of the host links 415. The above examples are described to illustrate various functions of the controller 430 during its operation in the computing system 400 and the present disclosure may not be limited by these examples.

The interconnect router 440, in some examples, may be coupled between the interface components 410 and the media port managers 460. A third signal paths 450 between the interconnect router 440 and the media port managers 460 may be configured to exchange data between them. The third signal paths 450 may be an example of the third signal paths 350 described with reference to FIG. 3. In some examples, each of the third signal paths 450 (e.g., the third signal path 450-*a*) may be configured to exchange data at a rate (e.g., 12.8 GBps) in accordance with the examples described above. In some examples, the interface component 410 may send decoded information to the interconnect router 440 at a data transfer rate (e.g., 25 GBps) through a first signal path 330-*c*. In some examples, the interface component 410 may receive information from the interconnect router 440 at a data transfer rate (e.g., 25 GBps) through a second signal path 335-*c*.

As one example, the controller 430 depicted in FIG. 4 includes two interface components 410-*a* and 410-*b* and may be capable of handling a total data transfer rate of 100 GBps. In some examples, an overhead associated with a host link protocol may occupy a part of the total data transfer rate and an actual bandwidth of the computing system 400 may be less than 100 GBps (e.g., 80 GBps). In some examples, a total bandwidth produced by a plurality of media ports (e.g., 51.2 GBps through the third signal paths 450, for example, 12.8 GBps per each of the third signal paths 450) may not saturate the actual bandwidth that the controller 430 may be configured to handle (e.g., 80 GBps). In some examples, a total bandwidth produced by a plurality of media ports (e.g., 102.4 GBps through the third signal paths 450, namely 25.6 GBps per each of the third signal path 450) may be greater than the actual bandwidth that the controller 430 may be configured to handle (e.g., 80 GBps) and may saturate the maximum host link capacity (e.g., 100 GBps data transfer rate).

In some cases, the controller 430 may include at least one host interface configured to receive a first access command from a host device, a plurality of port managers configured to access one or more memory media using a second access command that comprises an interleaved address, and an array of switches coupled between the at least one host interface and the plurality of port managers, the array of switches configured to generate the interleaved address based at least in part on the first access command.

In some cases, each port manager of the plurality of port managers may include a cache, an address translator configured to facilitate a wear-leveling operation, and a channel controller configured to control a channel associated with the one or more memory media. In some cases, the cache is configured based at least in part on the second access command and further includes a fully-associated write-back cache or a fully-associated content addressable memory, or a combination thereof. In some cases, each port manager of the plurality of port managers further includes a write-to-read buffer configured to store data written to the one or more memory media. In some cases, the at least one host interface includes a link interface configured to receive or transmit a packet comprising data, a link slave configured to decode a received packet, and a link master configured to generate a packet to transmit. In some cases, each port manager of the plurality may be coupled with a three-dimensional cross-point array of phase change memory cells.

In some cases, the controller 430 may be configured to interface with a host device and a memory medium and operable to receive, from the host device, a first access command for the memory medium, generate a second access command comprising an interleaved address for the memory medium based at least in part on receiving the first access command, and send the second access command to a local controller at the memory medium. In some cases, the controller 430 may be operable to distribute access operations across the memory medium to control a wear level associated with a part of the memory medium. In some cases, the controller 430 may be operable to receive a divided codeword from a channel of the memory medium, wherein the channel comprises one or more memory devices. In some cases, the controller 430 may be operable to write data to the memory medium based at least in part on sending the second access command and store the data at a buffer, wherein the buffer is configured to retain the data that is written to the memory medium with a time duration. In some cases, the controller 430 may be operable to decode a first packet received from the host device to extract an access request and an address associated with the access request and generate a second packet to transmit to the host device based at least in part on extracting the access request.

Figure 5A:
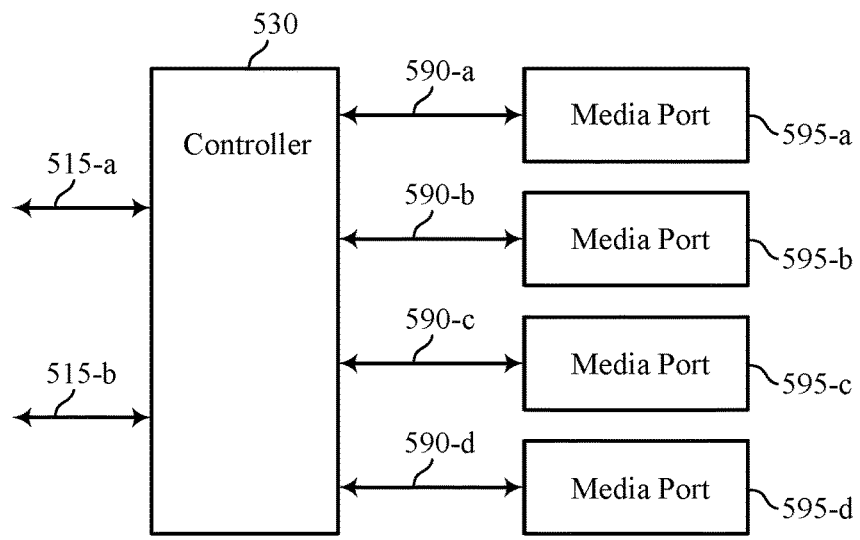
FIG. 5A illustrates an example of a memory subsystem that supports a multi-port storage-class memory interface in accordance with examples of the present disclosure.

FIG. 5A illustrates an example of a memory subsystem 501 that supports a multi-port storage-class memory interface in accordance with various examples of the present disclosure. The memory subsystem 501 may be an example of the device 105, the device 240, the memory subsystem 420 described with reference to FIGS. 1, 2, and 4. The memory subsystem 501 may include one or more host links 515, a controller 530, and one or more media ports 595. The host links 515 and the media ports 595 may be an example of the host links 415 and the media ports 495 described with reference to FIG. 4. The controller 530 may be an example of the processor 130, the controller 220, the device 300, or the controller 430 described with reference to FIGS. 1 through 4.

The controller 530 and the media ports 595 may exchange data through aggregated channels 590. The aggregated channels 590 may be examples of the aggregated channels 490 described with reference to FIG. 4. The aggregated channels 590 may be configured to support a data transfer rate (e.g., 12.8 GBps). In some examples, each media port of the media ports 595 (e.g., the media port 595-a) may be configured to have a memory capacity (e.g., 512 gigabytes). In some examples, each media port of the media ports 595 (e.g., the media port 595-a) may be configured to include a number of zones (e.g., 256×1,024 zones). In some examples, each zone of the number of zones may be configured to store a number of codewords (e.g., 16,384 codewords) in which each codeword may be 128 bytes large. In some examples, the number of zones in a media port may be fixed (e.g., 256×1,024 zones) and the size of codeword may be fixed (e.g., 128 bytes). A number of codewords that may be stored in each zone of the number of zones (e.g., 256×1,024 zones) of a media port may be determined based on a particular memory capacity of the media port.

Various addressing schemes may be utilized during operations of the memory subsystem 501. The following description illustrates an example of how the memory subsystem 501 depicted in FIG. 5A (e.g., the controller 530 coupled with four media ports 595, each media port configured with 512 gigabyte memory capacity) may operate with the various addressing schemes using a pure byte address form. Actual address form that may be implemented in the memory subsystem 501 may vary from the pure byte address form because various link interface protocols associated with the host links 515 may have different levels of truncation of addresses. For example, the Gen-Z protocol may have different truncation of addresses when compared to the CCIX protocol.

The memory subsystem 501 may receive, from a host device (not shown), a request associated with a host address. The host device may identify an allowable address range by reading registers on the controller 530 in the memory subsystem 501. As a way of example, the memory subsystem 501 may support a memory capacity of two terabytes (e.g., 512 gigabytes in each media port 595-a, 595-b, 595c, and 595-d). Two terabytes of memory capacity may be represented by addresses having 41 bits (e.g., A40 . . . A0, where A40 . . . A0 may represent a series of forty-one 0s and 1s in which A40 is the most significant bit (e.g., the 41st bit of the series of forty-one 0s and 1s) and A0 the least significant bit (e.g., the first bit of the series of forty-one 0s and 1s)).

For example, the host address may be associated with the addressing scheme having forty-one bits and may be considered as a sequential address. The lowest seven bits (e.g., A6 . . . A0) among forty-one bits may be allocated to designate one of 128 addresses within each codeword of 128 bytes. A codeword may be the smallest unit of data that the memory subsystem 501 may control (e.g., a granularity of 128 bytes). The next 2 bits of the 41 bits (e.g., A8 . . . A7) may be allocated to designate one of the four media ports. Remaining portion of the 41-bits host address (i.e., 32 bits of A40 . . . A9 out of A40 . . . A0) may be presented to each port (one of four media ports) and considered as a port logical address (PLA). It should be appreciated that once the logical address of the media port is determined, the addresses associated with PLA designates address spaces corresponding to one of the four media ports. Hence the port logical address may be considered as interleaved addresses across four media ports.

Each media port may be divided into a plurality of zones (e.g., 256×1,024 zones, i.e., 262,144 zones). Memory capacity of each zone (e.g., 2 megabytes, i.e., 2,097,152 bytes) of the plurality of zones may be further divided by a codeword size (e.g., 128 bytes) to determine a number of codewords that may be stored with each zone (e.g., 16,384 codewords of 128 bytes in each zone). The plurality of zones may facilitate a wear-leveling operation. Different zones within a media port may be utilized during the wear-leveling operation so that transactions (e.g., accessing memory cells of a media port) may be evenly distributed in time across the media port. In the example of 512 gigabyte media port, 18 bits of the 32-bits PLA may be allocated to designate one of 262,144 zones. The rest 14 bits of the 32-bits PLA may be allocated to designate one of 16,384 addresses to store codewords. One codeword of 16,383 codewords may be reserved as a blank space to allow intra-zone codeword rotation and only 16,383 of addresses may be used during wear-leveling operation.

The zone swapping and other supporting functions for the wear-leveling operation may be tracked by a zone translation SRAM/table (ZTS) in a media port manager (e.g., the media port managers 460 described with reference to FIG. 4). An 18-bit address contained in the ZTS may provide a lookup address to indicate a particular destination zone associated with the host request. In the present example of addresses having 41 bits, an intermediate address may be obtained by PLA div 16,383 in which div is an integer divide for the uppermost 18 bits producing the lower 14 bits as a remainder of the integer divide. The intermediate address may be referred to as the input address to the ZTS. Further, a physical address may be presented to a port channel controller (e.g., the port channel controller 375-a described with reference to FIG. 3). The upper portion of physical address may correspond to the lookup value retrieved from ZTS (e.g., designating one of 262,144 zones). The lower portion of physical address may be determined using the remaining 14 bits in conjunction with two pointers (e.g., a base pointer and a free pointer) facilitating intra-zone codeword rotation described with reference to FIG. 5B.

Figure 5B:
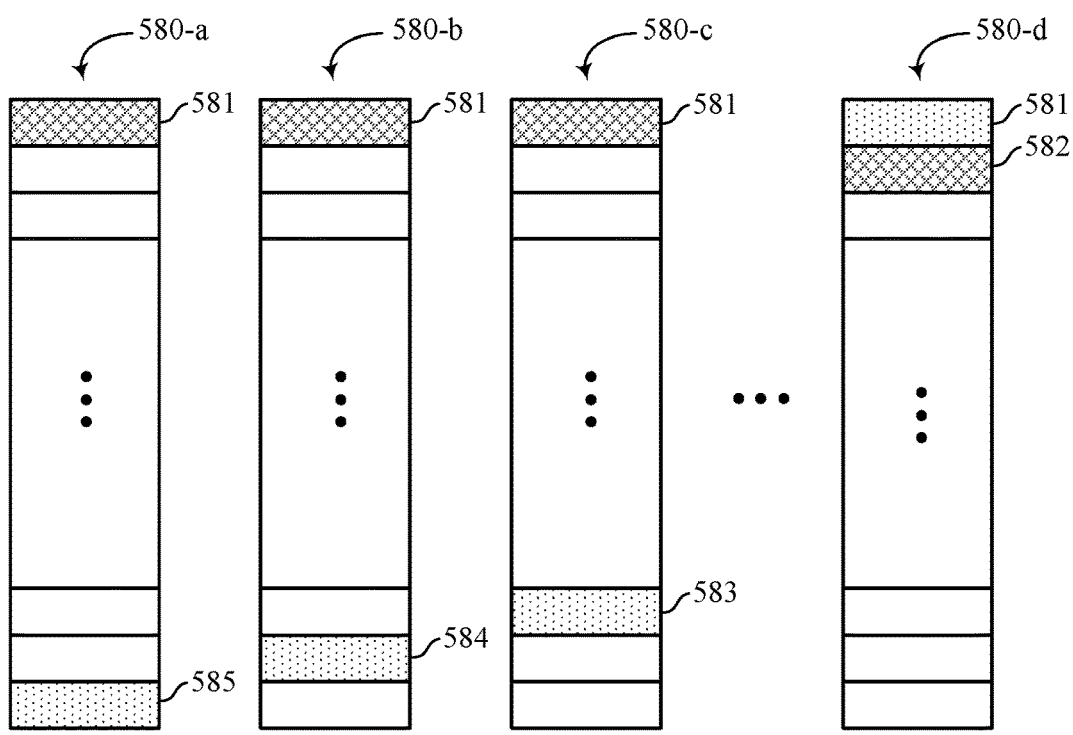
FIG. 5B shows a diagram illustrating a wear-leveling operation that supports a multi-port storage-class memory interface in accordance with examples of the present disclosure.

FIG. 5B shows a diagram 502 illustrating a wear-leveling operation that supports a multi-port storage-class memory interface in accordance with various examples of the present disclosure. The diagram 502 illustrates a zone diagram 580 at different stages of the wear-leveling operation. The zone diagram 580 may represent one of zones in a media port (e.g., a particular zone denoted as Zone_i) having N physical address locations and configured to store N−1 codewords. Addresses within Zone_i are illustrated with the first codeword address 581, the second codeword address 582, the (N−2) codeword address 583, the (N−1) codeword address 584, and the N codeword address 585. In some examples, N may correspond to 16,384 and each codeword may be 128 bytes.

For example, Zone_i may be located in the media port 595-*a* that may configured to include 256×1,024 zones. Each codeword address may be designated with a physical address described above. Among N codeword addresses in the zone, one codeword address may be designated as a blank space identified with the free pointer. In addition, another codeword address may be designated as a base identified with the base pointer. The blank space in a zone may facilitate the intra-zone codeword rotation described below. The zone diagram 580-*a* illustrates Zone_i configured with the first codeword address 581 assigned with the base pointer and the last codeword address (e.g., the N codeword address 585) assigned with the free pointer. The N codeword address 585 may initially be an extra memory address that is not within an addressable address space for Zone_i.

The controller 530, when a host request accessing a codeword associated with a host address is presented, may identify a physical codeword address to store contents of the codeword (e.g., when the host request includes a write operation). The controller 530 may determine a logical address associated with one of the media ports (e.g., the media port 595-*a*) based on the host address. The interconnect router 440 may be associated with the process of determining the logical address based on the host address. Subsequently, the controller 530 may determine an intermediate address using the information in ZTS within a media port manager (e.g., the media port manager 460-*a*) designating a destination (e.g., Zone_i in the media port 595-*a*).

In some examples, the controller 530 may determine the physical codeword address within Zone_i based on locations of the base pointer and the free pointer. By way of example, the controller 530 may determine to store the content of the codeword at a codeword address determined by the base pointer at the first codeword address 581 and the free pointer at the N codeword address 585 (e.g., determined by a relative distance in address space between the base pointer and the free pointer). In one example, the controller 530 may receive a requested address ($A_R$) to access (e.g., read or write) the content of the codeword, and determine the physical address to perform the access for the codeword according to an address given by Modulo($A_R$+Base, N) if the requested address is less than or equal to Modulo(Free−Base−1, N), and otherwise according to an address given by Modulo($A_R$+Base+1, N), where Base is the current value of the base pointer and Free is the current value of the free pointer. The controller may execute access commands (e.g., reads and writes) using the determined physical addresses.

The controller 530 may monitor a parameter associated with read and/or write operations and may move the free pointer to the (N−1) codeword address 584 as illustrated in the zone diagram 580-*b* when the parameter satisfies a threshold. Upon moving the free pointer to the (N−1) codeword address 584, the controller 530 may copy the codeword from the memory location corresponding to the updated value of the free pointer (e.g., N−1 for the case of zone diagram 580-*b*) to the memory location corresponding to the prior value of the free pointer (e.g., N for the case of zone diagram 580-*b*). The controller 530 may also reset the parameter.

For zone diagram 580-*b*, if the controller 530 is presented with a command accessing (e.g., reading or writing) the codeword having the codeword address 584 by the host device, the controller 530 may perform the command on the codeword at codeword address 585 (e.g., N) instead of the codeword address 584 (e.g., N−1) because of the different location of the free pointer. That is, the requested address 584 is not less than or equal to Modulo(Free−Base−1, N), and thus the controller 530 generates an offset address according to Modulo($A_R$+Base+1, N), which results in codeword address 585 (e.g., N). Then, (e.g., if the parameter subsequently satisfies the threshold again) the free pointer may be moved to the (N−2) codeword address 583 as illustrated in the zone diagram 580-*c*. Upon moving the free pointer to the (N−2) codeword address 583, the controller 530 may copy the codeword from the memory location corresponding to the updated value of the free pointer (e.g., N−2 for the case of zone diagram 580-*c*) to the memory location corresponding to the prior value of the free pointer (e.g., N−1 for the case of zone diagram 580-*c*). Thus, the controller 530 may store the content of the codeword having the same host address to different physical addresses (i.e., different physical memory cells) due to the intra-zone wear-leveling operation. The wear-leveling operation may distribute multiple transactions (e.g., read or write operations to memory cells) in time to avoid excessive write or read operations to a particular physical portion of a memory media (e.g., 3DXP dice).

The controller 530 may move the base pointer to a different codeword address (e.g., the second codeword address 582) when the free pointer rotates through the entire set of codeword addresses (e.g., rotating each time the parameter satisfies the threshold) within a zone while the base pointer is fixed at the first codeword address 581. For example, the controller 530 may move the free pointer to the first codeword address 581 (e.g., copying the codeword from the memory location corresponding to the updated value of the free pointer to the memory location corresponding to the prior value of the free pointer), and may (e.g., concurrently) update the base pointer to the second codeword address 582 as illustrated in the zone diagram 580-*d* of Zone_i. The controller 530 may rotate the free pointer through Zone_i (e.g., updating the value of the free pointer and copying the codeword from the location corresponding to the updated value to the location corresponding to the previous value each time the parameter satisfies the threshold) with the base pointer located at the second codeword address 582. As described above, access commands may be translated to offset addresses based on the requested addresses, the value of the base pointer, and a relationship between the requested addresses, the base pointer, and the free pointer. The access commands may be executed at the offset addresses. Further, the controller 530 may physically replace Zone_i with another zone of the media port (which may also be referred to as a zone swapping) to distribute transactions in time among the plurality of zones (e.g., 256×1,024 zones) within a media port (e.g., the media port 595-*a*).

The controller 530 may utilize the parameter to determine whether to relocate the free pointer, the base pointer, or both during the wear-leveling operation. Certain non-volatile memory technologies may exhibit different reliability characteristics depending on kinds of access operations performed on non-volatile memory cells. For example, a non-volatile memory cell may deteriorate more when a number of write operations are performed compared to the same number of read operations. In some cases, the controller 530 may track an access count including a number of write operations and a number of read operations performed on memory cells of a zone. The access count may, in some examples, include a weight factor to appropriately allocate reliability risks associated with a kind of access operation (e.g., write operations having a larger weight factor than that of read operations). That is, the controller 530 may increase the access count by a first factor for each read command and by a second factor for each write command. The controller 530 may determine whether to relocate the free pointer, the base pointer, or both, based on the access count, the base pointer, and the updated value of the free pointer (e.g., updating the base pointer when the free pointer is updated to equal the base pointer).

The threshold may be selected such that an endurance limit may be avoided. For example, the threshold may be selected such that repeated accesses to the same address location will cause the physical memory location to be rotated prior to the endurance limit being reached. In an example, the maximum lifetime ReadWrite Count may be 800 Million (e.g., 400M*1 for reads and 4M*100 for writes, where in this case the read factor is 1 and the write factor is 100). In this example, we may simplify for the purposes of illustration to look at writes only (e.g., an endurance limit of 4M writes). For a safe target, we wish to allow not more than ⅓ of the media lifetime capability to be reached under malicious attack, so we allow only 1.3M writes. We can go through 16,383 loops of decrementing the free pointer before we give relief, in the worst case. To cover the worst case, the threshold may be determined as 1.3333333M/16,383=81.39, and rounded down. Thus, the threshold may be set to be 81 write operations. Now translating that back to ReadWrite Count (e.g., with a write factor of 100), we set the ReadWrite Count threshold to 8100. In this example, this also means that for every 81 writes we would generate one additional write to copy the data to the new location as we decrement the free pointer. This constitutes a write amplification factor in the system, e.g., having 1 extra write for each 81, thus writes are amplified by a factor of 1+1/81=1.012x. This write amplification may not be a significant burden on the system performance, and may not result in significant overall medial lifetime capability given the wear leveling benefits.

Although discussed in the example shown in FIG. 5B as decrementing the free pointer when the access count reaches the threshold and incrementing the base pointer when the free pointer is decremented to be equal to the base pointer, the update directions may be reversed in some cases. That is, the free pointer may be incremented when the access count reaches the threshold and the base pointer may be decremented when the free pointer is incremented to be equal to the base pointer. The determination of the offset addresses would correspondingly change based on the directions of the updating of the free pointer and base pointer.

In addition, the memory subsystem 501 may be configured to avoid gaps in the host address while the memory subsystem 501 may have a plurality of media ports (e.g., media ports 595-a through 595-d) and the gaps in each of the media ports (e.g., every 16,383 codewords). Various parts of the controller 530, described with reference to FIG. 3, may be configured to implement this feature as described herein.

The media port managers 360 may store the logical addresses of the transaction at the cache 365 (e.g., the cache 365-a of the media port manager 360-a) based on the interconnect router 340 of the controller 530 routing a host link (e.g., the host link 515-a) to one of the media port managers (e.g., the media port manager 360-a). Subsequently, the address translator 370 (e.g., the address translator 370-a of the media port manager 360-a) may generate intermediate addresses associated with the logical addresses.

In some examples, an intermediate address may correspond to a logical address divided by an integer divider (e.g., IA=LA div 16,383). In addition, the zone swapping and other support functions related to the wear-leveling operation may be tracked by a Zone Translation SRAM (ZTS) in the address translator 370. In some examples, the intermediate addresses may be input addresses to the ZTS. An eighteen-bit address (i.e., corresponding to 256k zones) contained in the ZTS provides a look-up address to indicate the destination (i.e., a particular zone of the 256k zones) of the request. Subsequently, the address translator 370 may generate physical addresses of 16,383 codeword spaces within a zone (i.e., 16,384 spaces less one space designated with the free pointer) by using a functional relationship including the free pointer and the base pointer locations (e.g., a modulo operation as a function of the free pointer location and the base pointer location within a zone). Subsequently, the port channel controller 375 may manage the physical addresses for storing content of the transaction at a particular physical location within the memory media.

The wear-leveling operation illustrated above may, in some examples, be concurrently executed for different media ports (e.g., the media port 595-a through the media port 595-d) due to a completely separate port logic algorithm. Thus, the memory subsystem 501 may maintain the host address without any discontinuity despite the number of memory media ports, gaps existing in the plurality of zones (e.g., every 16,383 codewords) in any one media port while the memory subsystem 501 may distribute a number of transactions evenly across the media port to avoid certain physical codewords or groups of codewords from accumulating excessive access.

Figure 6:
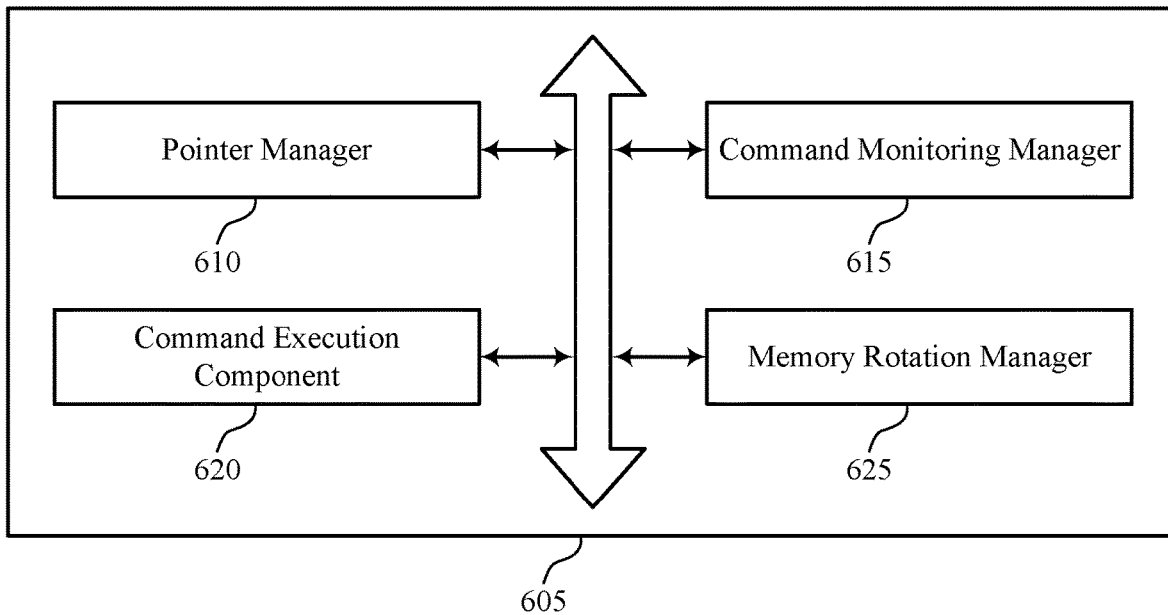
FIG. 6 shows a block diagram of a memory device that supports codeword rotation for zone grouping of media codewords in accordance with aspects of the present disclosure.

FIG. 6 shows a block diagram 600 of a memory device 605 that supports codeword rotation for zone grouping of media codewords in accordance with examples as disclosed herein. The memory device 605 may be an example of aspects of a memory device as described with reference to FIGS. 1-5. The memory device 605 may include a pointer manager 610, a command monitoring manager 615, a command execution component 620, and a memory rotation manager 625. Each of these modules may communicate, directly or indirectly, with one another (e.g., via one or more buses).

The pointer manager 610 may configure a value of a first pointer to correspond to a first memory address within a region of memory and a value of a second pointer to correspond to a second memory address within the region of memory. In some examples, the pointer manager 610 may update the value of the second pointer based on a quantity of the set of commands that are monitored satisfying a threshold. In some examples, the pointer manager 610 may update the value of the first pointer based on a correspondence between the updated value of the second pointer and the value of the first pointer. In some examples, the pointer manager 610 may configure a value of a first pointer to correspond to a first memory address within a region of memory and a value of a second pointer to correspond to a second memory address within the region of memory. In some examples, the pointer manager 610 may update the value of the second pointer to correspond to a third memory address within the region of memory based on the determining. In some examples, the pointer manager 610 may update the value of the second pointer each time the access count satisfies the threshold.

In some examples, updating the value of the second pointer includes decrementing the second pointer. In some examples, updating the value of the first pointer includes incrementing the first pointer. In some examples, the pointer manager 610 may update the value of the second pointer to correspond to the first memory address based on receiving the third set of commands. In some examples, the pointer manager 610 may update the value of the first pointer to correspond to a fourth memory address based on updating the value of the second pointer to correspond to the first memory address. In some cases, the updating the value of the first pointer is based on the value of the first pointer coinciding with the updated value of the second pointer. In some cases, the region of memory includes at least one extra memory address that is external to an addressable address space for the set of commands.

The command monitoring manager 615 may monitor a set of commands for performing access operations within the region of memory, the set of commands associated with requested addresses within the region of memory. In some examples, the command monitoring manager 615 may receive a first set of commands for performing access operations within the region of memory. In some examples, the command monitoring manager 615 may determine that a quantity of the first set of commands satisfies a threshold. In some examples, the command monitoring manager 615 may receive, subsequently to receiving the first set of commands, a second set of commands for performing access operations within the region of memory.

In some examples, the command monitoring manager 615 may track an access count associated with the set of commands executed at the region of memory, where updating the value of the second pointer is based on the access count satisfying the threshold. In some examples, the command monitoring manager 615 may increase a value associated with the access count by a first factor for each read command executed at the region of memory and a second factor for each write command executed at the region of memory. In some examples, the command monitoring manager 615 may reset the access count each time the access count satisfies the threshold. In some examples, the command monitoring manager 615 may receive, subsequent to receiving the second set of commands, a third set of commands for performing access operations within the region of memory. In some examples, the command monitoring manager 615 may receive a fourth set of commands for performing access operations within the region of memory.

The command execution component 620 may execute the set of commands on a set of locations within the region of memory, the set of locations based on the requested addresses, the value of the first pointer, and the value of the second pointer. In some examples, executing the second set of commands, where the executing includes offsetting a command accessing the third memory address to the second memory address based on the first pointer and the second pointer.

In some examples, the command execution component 620 may determine offset memory addresses for performing accesses within the region of memory based at least on part on the requested addresses of the set of commands, the first pointer, and relationships of the requested addresses to the first pointer and the second pointer. In some examples, executing the fourth set of commands, where executing the fourth set of commands includes offsetting requested addresses of a first subset of the fourth set of commands by a first amount and offsetting requested addresses of a second subset of the fourth set of commands by a second amount.

The memory rotation manager 625 may copy, based on updating the value of the second pointer, a codeword from the third memory address to the second memory address. In some examples, the memory rotation manager 625 may copy, based on updating the value of the second pointer from the second memory address to a third memory address, a codeword from the a memory location corresponding to the updated value of the second pointer to a memory location corresponding to a previous value of the second pointer. In some examples, the memory rotation manager 625 may copy a codeword from a memory location corresponding to the updated value of the second pointer to a memory location corresponding to a previous value of the second pointer each time the access count satisfies the threshold. In some cases, each memory address of the region of memory is associated with a different codeword.

Figure 7:
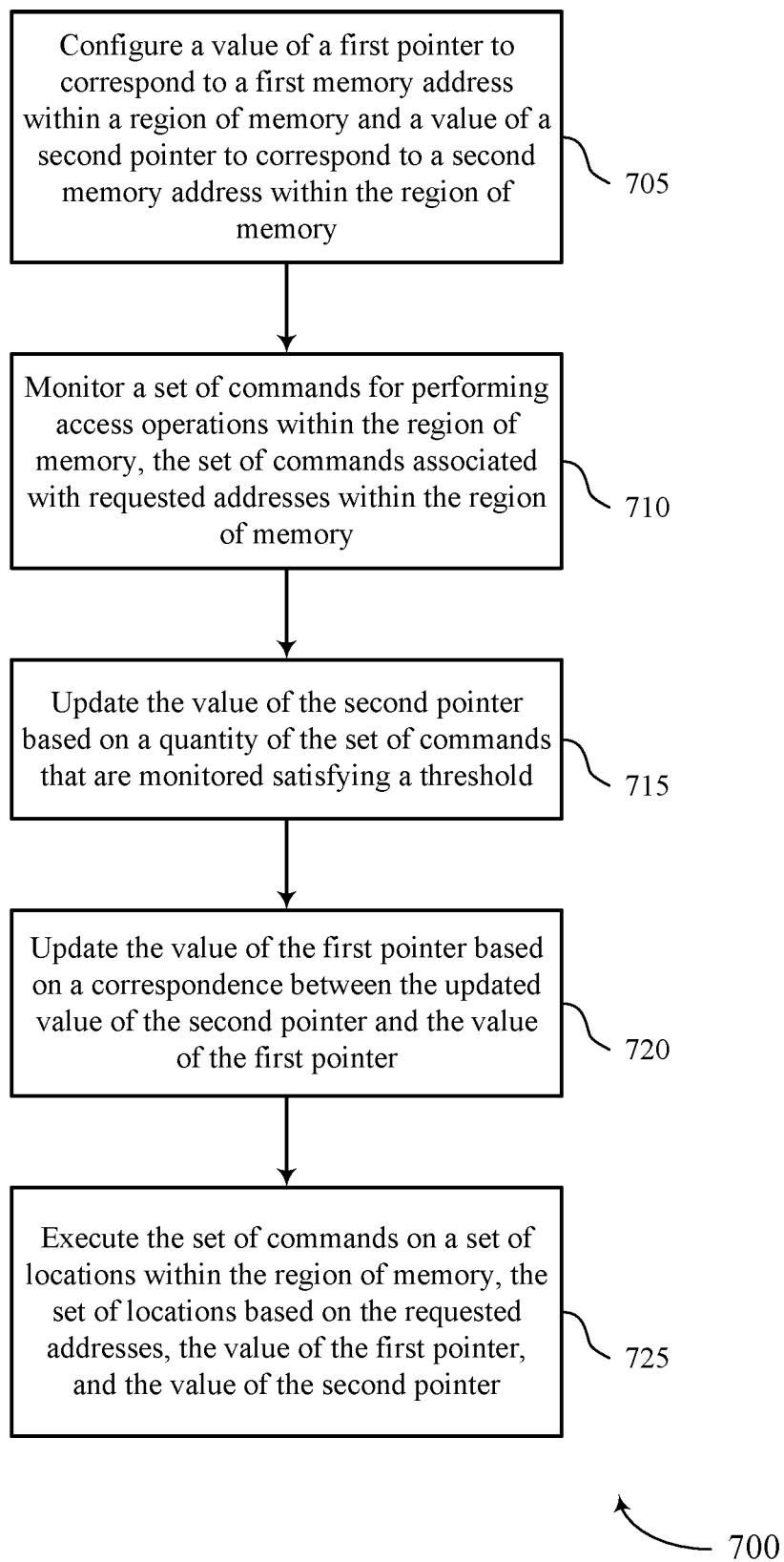
FIGS. 7 and 8 show flowcharts illustrating a method or methods that support codeword rotation for zone grouping of media codewords in accordance with aspects of the present disclosure.

FIG. 7 shows a flowchart illustrating a method or methods 700 that supports codeword rotation for zone grouping of media codewords in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may configure a value of a first pointer to correspond to a first memory address within a region of memory and a value of a second pointer to correspond to a second memory address within the region of memory. The operations of 705 may be performed according to the methods described herein. In some examples, aspects of the operations of 705 may be performed by a pointer manager as described with reference to FIG. 6.

At 710, the memory device may monitor a set of commands for performing access operations within the region of memory, the set of commands associated with requested addresses within the region of memory. The operations of 710 may be performed according to the methods described herein. In some examples, aspects of the operations of 710 may be performed by a command monitoring manager as described with reference to FIG. 6.

At 715, the memory device may update the value of the second pointer based on a quantity of the set of commands that are monitored satisfying a threshold. The operations of 715 may be performed according to the methods described herein. In some examples, aspects of the operations of 715 may be performed by a pointer manager as described with reference to FIG. 6.

At 720, the memory device may update the value of the first pointer based on a correspondence between the updated value of the second pointer and the value of the first pointer. The operations of 720 may be performed according to the methods described herein. In some examples, aspects of the operations of 720 may be performed by a pointer manager as described with reference to FIG. 6.

At 725, the memory device may execute the set of commands on a set of locations within the region of memory, the set of locations based on the requested addresses, the value of the first pointer, and the value of the second pointer. The operations of 725 may be performed according to the methods described herein. In some examples, aspects of the operations of 725 may be performed by a command execution component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for configuring a value of a first pointer to correspond to a first memory address within a region of memory and a value of a second pointer to correspond to a second memory address within the region of memory, monitoring a set of commands for performing access operations within the region of memory, the set of commands associated with requested addresses within the region of memory, updating the value of the second pointer based on a quantity of the set of commands that are monitored satisfying a threshold, updating the value of the first pointer based on a correspondence between the updated value of the second pointer and the value of the first pointer, and executing the set of commands on a set of locations within the region of memory, the set of locations based on the requested addresses, the value of the first pointer, and the value of the second pointer.

Some examples of the method 700 and the apparatus described herein may further include operations, features, means, or instructions for copying, based on updating the value of the second pointer from the second memory address to a third memory address, a codeword from the a memory location corresponding to the updated value of the second pointer to a memory location corresponding to a previous value of the second pointer.

In some examples of the method 700 and the apparatus described herein, monitoring the set of commands further may include operations, features, means, or instructions for tracking an access count associated with the set of commands executed at the region of memory, where updating the value of the second pointer may be based on the access count satisfying the threshold.

In some examples of the method 700 and the apparatus described herein, tracking the access count may include operations, features, means, or instructions for increasing a value associated with the access count by a first factor for each read command executed at the region of memory and a second factor for each write command executed at the region of memory.

Some examples of the method 700 and the apparatus described herein may further include operations, features, means, or instructions for resetting the access count each time the access count satisfies the threshold, updating the value of the second pointer each time the access count satisfies the threshold, and copying a codeword from a memory location corresponding to the updated value of the second pointer to a memory location corresponding to a previous value of the second pointer each time the access count satisfies the threshold.

In some examples of the method 700 and the apparatus described herein, updating the value of the second pointer may include operations, features, means, or instructions for decrementing the second pointer, and updating the value of the first pointer may include operations, features, means, or instructions for incrementing the first pointer.

In some examples of the method 700 and the apparatus described herein, the updating the value of the first pointer may be based on the value of the first pointer coinciding with the updated value of the second pointer.

In some examples of the method 700 and the apparatus described herein, the region of memory includes at least one extra memory address that may be external to an addressable address space for the set of commands, and the configuring the second pointer includes assigning the value of the second pointer to the at least one extra memory address.

In some examples of the method 700 and the apparatus described herein, each memory address of the region of memory may be associated with a different codeword.

In some examples of the method 700 and the apparatus described herein, the executing the set of commands may include operations, features, means, or instructions for determining offset memory addresses for performing accesses within the region of memory based at least on part on the requested addresses of the set of commands, the first pointer, and relationships of the requested addresses to the first pointer and the second pointer.

Figure 8:
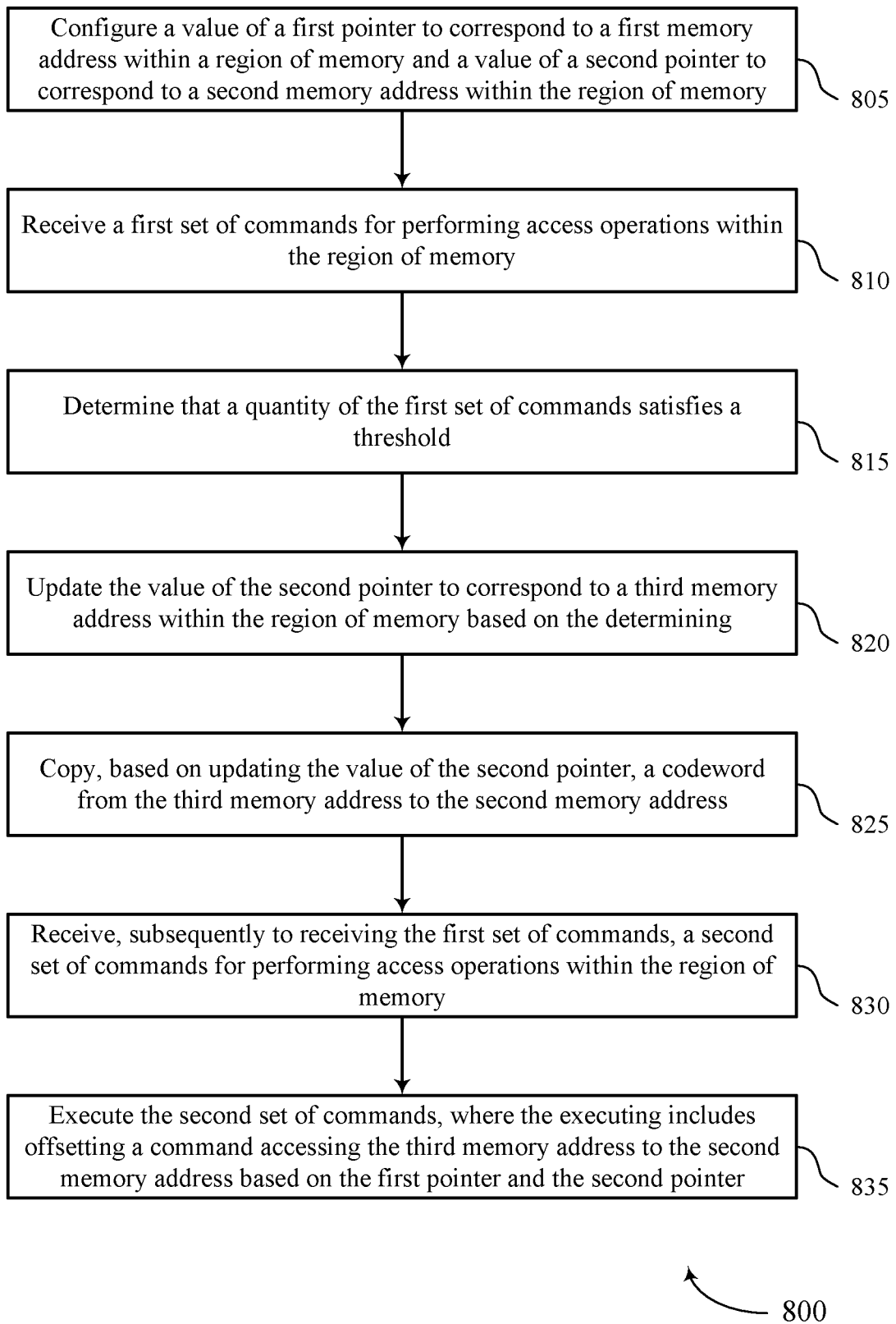

FIG. 8 shows a flowchart illustrating a method or methods 800 that supports codeword rotation for zone grouping of media codewords in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may configure a value of a first pointer to correspond to a first memory address within a region of memory and a value of a second pointer to correspond to a second memory address within the region of memory. The operations of 805 may be performed according to the methods described herein. In some examples, aspects of the operations of 805 may be performed by a pointer manager as described with reference to FIG. 6.

At 810, the memory device may receive a first set of commands for performing access operations within the region of memory. The operations of 810 may be performed according to the methods described herein. In some examples, aspects of the operations of 810 may be performed by a command monitoring manager as described with reference to FIG. 6.

At 815, the memory device may determine that a quantity of the first set of commands satisfies a threshold. The operations of 815 may be performed according to the methods described herein. In some examples, aspects of the operations of 815 may be performed by a command monitoring manager as described with reference to FIG. 6.

At 820, the memory device may update the value of the second pointer to correspond to a third memory address within the region of memory based on the determining. The operations of 820 may be performed according to the methods described herein. In some examples, aspects of the operations of 820 may be performed by a pointer manager as described with reference to FIG. 6.

At 825, the memory device may copy, based on updating the value of the second pointer, a codeword from the third memory address to the second memory address. The operations of 825 may be performed according to the methods described herein. In some examples, aspects of the operations of 825 may be performed by a memory rotation manager as described with reference to FIG. 6.

At 830, the memory device may receive, subsequently to receiving the first set of commands, a second set of commands for performing access operations within the region of memory. The operations of 830 may be performed according to the methods described herein. In some examples, aspects of the operations of 830 may be performed by a command monitoring manager as described with reference to FIG. 6.

At 835, the memory device may execute the second set of commands, where the executing includes offsetting a command accessing the third memory address to the second memory address based on the first pointer and the second pointer. The operations of 835 may be performed according to the methods described herein. In some examples, aspects of the operations of 835 may be performed by a command execution component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for configuring a value of a first pointer to correspond to a first memory address within a region of memory and a value of a second pointer to correspond to a second memory address within the region of memory, receiving a first set of commands for performing access operations within the region of memory, determining that a quantity of the first set of commands satisfies a threshold, updating the value of the second pointer to correspond to a third memory address within the region of memory based on the determining, copying, based on updating the value of the second pointer, a codeword from the third memory address to the second memory address, receiving, subsequently to receiving the first set of commands, a second set of commands for performing access operations within the region of memory, and executing the second set of commands, where the executing includes offsetting a command accessing the third memory address to the second memory address based on the first pointer and the second pointer.

Some examples of the method 800 and the apparatus described herein may further include operations, features, means, or instructions for receiving, subsequent to receiving the second set of commands, a third set of commands for performing access operations within the region of memory, updating the value of the second pointer to correspond to the first memory address based on receiving the third set of commands, and updating the value of the first pointer to correspond to a fourth memory address based on updating the value of the second pointer to correspond to the first memory address.

Some examples of the method 800 and the apparatus described herein may further include operations, features, means, or instructions for receiving a fourth set of commands for performing access operations within the region of memory, and executing the fourth set of commands, where executing the fourth set of commands includes offsetting requested addresses of a first subset of the fourth set of commands by a first amount and offsetting requested addresses of a second subset of the fourth set of commands by a second amount.

It should be noted that the methods described above describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a controller associated with one or more memory devices, wherein the controller is configured to cause the apparatus to:
        configure a first value of a first pointer to correspond to a first memory address within the one or more memory devices and a second value of a second pointer to correspond to a second memory address within the one or more memory devices;
        monitor a plurality of commands for performing memory access operations within the one or more memory devices, the plurality of commands associated with requested memory addresses within the one or more memory devices;
        update the second pointer from the second value to a third value based at least in part on a quantity of the plurality of commands satisfying a threshold;
        update the first pointer from the first value to a fourth value based at least in part on a correspondence between the third value of the second pointer and the first value of the first pointer; and
        execute the plurality of commands on a set of memory locations within the one or more memory devices, the set of memory locations based at least in part on the requested memory addresses, the fourth value of the first pointer, and the third value of the second pointer.

2. The apparatus of claim 1, wherein the controller is further configured to cause the apparatus to:
    copy, based at least in part on updating the second pointer from the second value to the third value, a codeword from a memory location corresponding to the third value of the second pointer to a memory location corresponding to a previous value of the second pointer.

3. The apparatus of claim 1, wherein to monitor the plurality of commands, the controller is further configured to cause the apparatus to:
    track an access count associated with the plurality of commands executed at the set of memory locations, wherein updating the second pointer is based at least in part on the access count satisfying the threshold.

4. The apparatus of claim 3, wherein to track the access count, the controller is further configured to cause the apparatus to:
    increase a value associated with the access count by a first factor for each read command executed at the set of memory locations and a second factor for each write command executed at the set of memory locations.

5. The apparatus of claim 3, wherein the controller is further configured to cause the apparatus to:
    reset the access count each time the access count satisfies the threshold;
    update a value of the second pointer each time the access count satisfies the threshold; and
    copy a codeword from a memory location corresponding to the updated value of the second pointer to a memory location corresponding to a previous value of the second pointer each time the access count satisfies the threshold.

6. The apparatus of claim 1, wherein:
    to update the second pointer from the second value to the third value, the controller is further configured to cause the apparatus to decrement the second pointer; and
    to update the first pointer from the first value to the fourth value, the controller is further configured to cause the apparatus to increment the first pointer.

7. The apparatus of claim 1, wherein to update the first pointer from the first value to the fourth value is based at least in part on the first value of the first pointer coinciding with the third value of the second pointer.

8. The apparatus of claim 1, wherein:
    the set of memory locations comprises at least one extra memory address that is external to an addressable address space for the plurality of commands; and
    to configure the second value of the second pointer, the controller is further configured to cause the apparatus to assign the second value of the second pointer to the at least one extra memory address.

9. The apparatus of claim 1, wherein each memory address of the set of memory locations is associated with a different codeword.

10. The apparatus of claim 1, wherein to execute the plurality of commands the controller is further configured to cause the apparatus to:
    determine offset memory addresses for performing accesses within the set of memory locations based at least on part on the requested addresses of the plurality of commands, the first pointer, and relationships of the requested addresses to the first pointer and the second pointer.

11. An apparatus, comprising:
    a controller associated with one or more memory devices, wherein the controller is configured to cause the apparatus to:
        configure a value of a first pointer to correspond to a first memory address within a region of memory of the one or more memory devices and a value of a second pointer to correspond to a second memory address within the region of memory;
        receive a first plurality of commands for performing access operations within the region of memory;
        determine that a quantity of the first plurality of commands satisfies a threshold;
        update the value of the second pointer to correspond to a third memory address within the region of memory based at least in part on the determining;
        copy, based at least in part on updating the value of the second pointer, a codeword from the third memory address to the second memory address;
        receive, subsequent to receiving the first plurality of commands, a second plurality of commands for performing access operations within the region of memory; and
        execute the second plurality of commands, wherein the executing comprises offsetting a command accessing the third memory address to the second memory address based at least in part on the first pointer and the second pointer.

12. The apparatus of claim 11, wherein the controller is further configured to cause the apparatus to:
receive, subsequent to receiving the second plurality of commands, a third plurality of commands for performing access operations within the region of memory;
update the value of the second pointer to correspond to the first memory address based at least in part on receiving the third plurality of commands; and
update the value of the first pointer to correspond to a fourth memory address based at least in part on updating the value of the second pointer to correspond to the first memory address.

13. The apparatus of claim 12, wherein the controller is further configured to cause the apparatus to:
receive a fourth plurality of commands for performing access operations within the region of memory; and
execute the fourth plurality of commands, wherein executing the fourth plurality of commands comprises offsetting requested addresses of a first subset of the fourth plurality of commands by a first amount and offsetting requested addresses of a second subset of the fourth plurality of commands by a second amount.

14. An apparatus, comprising:
a controller associated with a plurality of zones, wherein each zone of the plurality of zones is associated with one or more memory devices, and wherein the controller is configured to cause the apparatus to:
configure an address space having contiguous addressing, wherein the address space is mapped across the plurality of zones, and wherein each zone comprises a free memory location;
execute a first plurality of received commands associated with corresponding received addresses within the address space on a first set of memory locations within the plurality of zones, the first set of memory locations based at least in part on the corresponding received memory addresses for the first plurality of received commands and the free memory locations of the plurality of zones, wherein a portion of the first plurality of received commands are for a first zone of the plurality of zones;
modify the free memory location of the first zone based at least in part on a parameter associated with the portion of received commands satisfying a threshold; and
execute a second plurality of received commands associated with corresponding received addresses within the address space on a second set of memory locations within the plurality of zones, the second set of memory locations based at least in part on the corresponding received memory addresses for the second plurality of received commands and the free memory locations of the plurality of zones, the free memory locations of the plurality of zones comprising the modified free memory location of the first zone.

15. The apparatus of claim 14, wherein each zone is configured to store a plurality of codewords.

16. The apparatus of claim 14, wherein the parameter associated with the portion of received commands comprises a quantity of the plurality of received commands for the first zone.

17. The apparatus of claim 14, wherein to modify the free memory location of the first zone, the controller is further configured to cause the apparatus to:
rotate the free memory location to a different memory location within the first zone.

18. The apparatus of claim 17, wherein to rotate the free memory location to a different memory location within the first zone, the controller is further configured to cause the apparatus to:
change the free memory location to a contiguous codeword address of the first zone.

19. The apparatus of claim 14, wherein the free memory location of the first zone is configured to be set to a first memory location of the first zone before the first plurality of received commands are executed, and
wherein to modify the free memory location of the first zone, the controller is further configured to cause the apparatus to:
change the free memory location from the first memory location of the first zone to a second memory location of the first zone.

20. The apparatus of claim 19, wherein the controller is further configured to cause the apparatus to:
copy a codeword from the first memory location of the first zone to the second memory location of the first zone, based at least in part on modifying the free memory location of the first zone.

* * * * *